United States Patent [19]

Yamada et al.

[11] Patent Number: 4,659,588

[45] Date of Patent: Apr. 21, 1987

[54] METHOD OF PRODUCING OPTICAL RECORDING MEDIUM

[75] Inventors: Noboru Yamada; Kenichi Nishiucki; Mutsuo Takenaga, all of Osaka, Japan

[73] Assignee: Matsushita Electric Industrial Co., Ltd., Osaka, Japan

[21] Appl. No.: 624,571

[22] Filed: Jun. 26, 1984

[30] Foreign Application Priority Data

Jun. 27, 1983 [JP] Japan .................. 58-116317
Dec. 9, 1983 [JP] Japan .................. 58-233009

[51] Int. Cl.$^4$ .................. B05D 3/06; B05D 5/06
[52] U.S. Cl. .................. 427/42; 427/162; 427/164; 427/166; 427/248.1; 427/255
[58] Field of Search .......... 427/162, 164, 166, 248.1, 427/255, 35, 42, 53.1

[56] References Cited

U.S. PATENT DOCUMENTS 3,971,874 7/1976 Ohta et al. .................. 427/166
4,278,734 7/1981 Ohta et al. .................. 428/432
4,357,366 11/1982 Takaoka et al. .................. 427/166

OTHER PUBLICATIONS

Proceedings of the 1983 Japan Display.
Proceedings of SPIE vol. 329 Optical Disk Technology (1982).
Proceedings of the 28th Joint Assembly of Applied Physics Association, p. 108, 1981.

Primary Examiner—Sadie L. Childs

[57] ABSTRACT

The present invention relates to a method of producing an optical recording medium containing a thin film photosensitive layer provided on a board. When subjected to an optical energy, the optical density of this thin film photosensitive layer varies. Such optical recording medium is formed by the method of (a) mixing tellurium dioxide $TeO_2$ and a reducing substance or substances, (b) heating the obtained mixture and causing part of the $TeO_2$ to react with the reducing substance to obtain a sintered body and (c) obtaining a $TeO_2$ compound thin film photosensitive layer on a board by evaporation and deposition, using the sintered body obtained in steps (a) and (b) as the vacuum deposition source. The optical recording medium possessing such a $TeO_2$ compound thin film photosensitive layer may be used as both a one-time recording type medium and as an erasable type medium, capable of erasing the previously recorded information and recording new information in its place.

42 Claims, 10 Drawing Figures

METHOD OF PRODUCING OPTICAL RECORDING MEDIUM

FIELD OF THE INVENTION

This invention relates to a method of producing an optical recording medium capable of recording information, erasing previously recorded information or recording new information while erasing recorded information, and more particularly to a method of producing the medium by preliminarily forming a sintered body of tellurium oxide compound and using this sintered body as a vacuum deposition source.

BACKGROUND OF THE INVENTION

U.S. Pat. No. 3,971,874 proposes a recording material having a thin film of tellurium oxide deposited on a base. The composition of the deposited tellurium oxide is expressed by the formula: $TeO_x$, where Te is tellurium, O is oxygen, which is coupled with tellurium so as to form its oxide, and x is the ratio of the total number of atoms of oxygen to that of tellurium, which is defined as $0 < x < 2$.

When the thin film is irradiated with light, such as a laser beam, its temperature increases due to the absorption of light energy and the optical density of the thin film changes from a low state to a high state.

Thin films made of the composition $TeO_x$ are widely used in recording disks for still picture file systems, document file systems and other systems as an optical recording thin film of high sensitivity and high signal quality.

The following methods have been proposed for forming a thin film from $TeO_x$:

1. The use of vacuum deposition, whereby $TeO_2$ powder is placed on a tungsten or molybdenum boat, such as disclosed in U.S. Pat. No. 3,971,874. In this method, the tungsten or molybdenum boat is heated to cause a reduction reaction with the $TeO_2$ on the boat surface, and vacuum deposition is conducted to remove some of the oxygen from the $TeO_2$ in order to obtain a thin film of $TeO_x$, where $0 < x < 2$.

2. Evaporating and depositing sources of Te and $TeO_2$ simultaneously on a board by controlling the vacuum deposition temperature in the individual sources, as disclosed in the Proceedings of the 28th Joint Assembly of Applied Physics Associations, p. 108, 1981.

3. Mixing a metal, to be used as a reducing substance, with $TeO_2$ and evaporating while causing the mixture to be reduced in a quartz crucible by use of a coil heater or the like, as disclosed in the Proceedings of the 28th Joint Assembly of Applied Physics Associations, p. 108, 1981, and the Proceedings of SPIE, Vol. 329, Optical Disk Technology, p. 195, 1982. In this method, $TeO_2$ and a powder of a reducing metal are preliminarily mixed, and the mixture is heated in a quartz crucible to perform vacuum deposition and reduce the $TeO_2$.

Another proposed technology for obtaining an erasable optical information recording thin film includes using $TeO_x$, where $0 < x < 2$, as the principal material and combining it with additives, such as disclosed in U.S. Pat. No. 4,278,734 and our copending U.S. patent application Ser. No. 594,561. Selenium, sulfur, germanium, tin, or others may be used as the additives.

These erasable optical information recording thin films may be repeatedly used, and as such, a higher degree of homogeneity and reproducibility of the film composition is required than in the conventional recording thin films of the non-erasable (one-time recording) type.

The following methods have been employed for using $TeO_x$ in combination with additives in thin films:

1. Using $TeO_2$ and Te sources and, for example, Ge and Sn as sources of additives, and evaporating these ingredients simultaneously on a board by controlling the heating temperature of each of the sources. This method is disclosed in our copending U.S. patent application Ser. No. 594,561, and the Proceedings of 1983 Japan Display pp. 46 to 48.

2. Using $TeO_2$ source and an alloy source of Te with additives, such as Ge and Sn, and evaporating these ingredients on a board by controlling the heating temperature of each source, as disclosed in our copending U.S. patent application Ser. No. 594,561.

3. Placing the mixed raw material, comprising $TeO_2$ and a metal or a semimetal substance used as an additive, on a metal boat having reducing ability, such as a tungsten or molybdenum boat, and using vacuum deposition. This is disclosed in U.S. Pat. No. 4,278,734 and our copending U.S. patent application Ser. No. 594,561. In this method, the metal boat is heated to cause a reduction reaction with $TeO_2$ on the boat surface, and vacuum deposition is performed to remove $TeO_x$, where $0 < x < 2$, containing the additive.

4. Using the method described in paragraph 3 above and mixing a small amount of a powdered reducing agent, such as Fe, Cr or W, preliminarily into the mixture powder of $TeO_2$ and additive instead of the metallic boat, as disclosed in our copending U.S. patent application Ser. No. 594,561. In this method, the raw materials are put in a quartz crucible or other stable container, which does not substantially react with the raw materials, and the outer wall of the container is heated by a coil heater or the like to cause a reduction reaction between the $TeO_2$ and the reduction material. A thin film of TeOhd x, where $0 < x < 2$, is obtained by evaporating while removing part of the oxygen from $TeO_2$, and the additive is contained in the thin film during the evaporation.

Accordingly, it is an object of the present invention to provide a method of easily and efficiently producing an optical recording thin film medium containing $TeO_x$, where $0 < x < 2$, the thin film medium having uniform quality, and excellent reproducibility.

It is another object of the present invention to provide a method of containing additives in an erasable thin film formed of $TeO_x$, where $0 < x < 2$, which method is both easy to perform and yields excellent reproducibility.

In accordance with the objects of the present invention, a method of producing an optical recording medium includes the steps of mixing tellurium dioxide $TeO_2$ and a reducing substance, forming a sintered body by treating the mixture, using the sintered body to deposit an optical recording thin film on a support.

More specifically, the method of producing an optical recording medium of the present invention includes, a first step of mixing tellurium dioxide $TeO_2$ and a reducing substance, a second step of heat-treating the mixture obtained in the first step and causing part of the $TeO_2$ to react with the reducing substance to form a sintered body, and a third step of evaporating and forming a tellurium oxide compound optical recording thin film on a board by using the sintered body obtained in the second step as a vacuum deposition source.

In the first step, a mortar or a ball mill is used to mix tellurium dioxide $TeO_2$ and the reducing substance. In the second step, the mixture obtained in the first step is dried, put on a quartz boat and placed into an electric furnace to be heated in an inert gas atmosphere, so that a sintered body is formed. The heat treatment temperature is set within a range of 400° C. to 1,000° C. A preferred heating range is 600° C. to 700° C. The reducing substance may be at least one element selected from the group consisting of Al, Si, Ti, V, Cd, In, Sn, Sb, Ta, W, Cr, Mn, Fe, Co, Ni, Cu, Zn, Ge, Mo, Bi, Pb, S, Se, and C. If the reducing substance is represented as M, the sintered body is at least an aggregated body of M-Te alloy, M-O oxide and $TeO_2$.

It is preferred that the reducing substance be at least one element selected from the group consisting of Cu, Sn, Pb, Al, In, Zn, Bi, Ge, Se, and Cd. It is more preferred that the reducing substance be at least one element selected from the group consisting of Cu, Al, Sb, Pb, and In. The mixing ratio $\alpha$ of this reducing substance is set within a range of 15 mol% $\leq \alpha \leq$ 80 mol%.

In the third step, a vacuum deposition apparatus is used, and the sintered body obtained in the second step is put in a quartz container, heated by a suitable heating means, and a tellurium compound optical recording thin film is evaporated on a board placed on a support stand within the vacuum deposition apparatus. The heating means may include a heater or an electron beam. If an electron beam is used, pellets may be used as the vacuum deposition source. The pellets are obtained by pulverizing the sintered body and compacting and forming the pulverized sintered body into a pellet by use of a press.

The degree of vacuum of the vacuum deposition apparatus is set in a range of $10^{-3}$ Torr to $10^{-7}$ Torr, and more preferably below $10^{-5}$ Torr.

In another embodiment, Cu is selected as the reducing substance and its mixing ratio $\alpha$ is set within the range $15 \leq \alpha \leq 80$ mol%.

In still another embodiment, Al is selected as the reducing substance and its mixing ratio $\alpha$ is set within the range 20 mol% $\leq \alpha \leq$ 60 mol%.

In a further embodiment, Al and Cu are selected as the reducing substances and are mixed simultaneously, with their mixing ratios $\alpha_1$, $\alpha_2$ being respectively defined within the ranges 15 mol% $\leq \alpha_1 \leq$ 50 mol%, 20 mol% $\leq \alpha_2 \leq$ 60 mol%, and 50 mol% $\leq \alpha_1 + \alpha_2 \leq$ 80 mol%.

An alternative method of producing an optical recording medium in accordance with the present invention includes mixing tellurium dioxide $TeO_2$ and a reducing substance, forming a sintered body by treating the mixture, mixing the sintered body with an additive material and using this mixture to deposit an optical recording thin film on a support.

More specifically, this alternative method includes a first step of mixing tellurium dioxide $TeO_2$ and a reducing substance, a second step of heat-treating the mixture obtained in the first step and causing part of the $TeO_2$ to react with the reducing substance to form a sintered body, a third step of mixing an additive to the sintered body obtained in the second step for enhancing the erasability of the optical recording medium, and a fourth step of evaporating a tellurium oxide compound optical recording thin film on a board by using the mixture obtained in the third step as the vacuum deposition source.

In this alternate embodiment, the additives, Ti, V, Ta, Cr, Mo, W, Mn, Fe, Co, Ni, Pt, Cu, Ag, Zn, Cd, Al, In, Tl, Si, Ge, Sn, Pb, As, Sb, Bi, S, Se, and Au may be used either alone or in oxide form, independently or as a compound of substances. The content B of the additives is set in a range of 10 weight (wt.)% $\leq B \leq$ 40 wt.%.

Preferably, the additive is at least one element selected from the group comprising Zn, Cd, In, Tl, Ge, Sn, Pb, As, Sb, Bi, S and Se and more preferably is at least one element selected from the group comprising Ge, Sn, Se, Bi, In and Zn. In addition, the content B of the additive is particularly effective when set within a range of 10 wt.% $\leq B \leq$ 30 wt.%.

It is also possible to use, as the additive, at least one compound selected from the group of compounds consisting of Ti-Te, V-Te, Ta-Te, Cr-Te, Mo-Te, W-Te, Mn-Te, Fe-Te, Co-Te, Ni-Te, Pt-Te, Cu-Te, Ag-Te, Zn-Te, Cd-Te, Al-Te, In-Te, m Tl-Te, Si-Te, Ge-Te, Sn-Te, Pb-Te, As-Te, Sb-Te, Bi-Te, S-Te, Se-Te, and Au-Te.

It is also possible to use, as the additive, either independently or in combination, the Te compounds selected from the group consisting of Ge-Te, Sn-Te, In-Te, Pb-Te, Sb-Te, Se-Te, Zn-Te, Al-Te, Bi-Te, Cu-Te and Au-Te.

As the vacuum deposition source, Ge may be combined with at least one compound selected from the group consisting of Sn-Te, In-Te, Pb-Te, Sb-Te, Se-Te, Zn-Te, Al-Te, Bi-Te, Cu-Te and Au-Te. In this case, the content B of Ge is set in a range of 0 wt.% $\leq B \leq$ 10 wt.%.

In the fourth step of this alternate embodiment, a vacuum deposition apparatus is used, and the mixture obtained in the third step is put in a quartz container, heated by a heating means, and a tellurium compound optical recording thin film is evaporated and formed on a board placed on a support stand located within the vacuum deposition apparatus. A coil heater is used as the heating means and the heater temperature is set within a range of 500° C. to 1,000° C.

It is effective to set the degree of vacuum of the vacuum deposition apparatus within the range of $10^{-3}$ Torr to $10^{-7}$ Torr, and more preferably below $10^{-5}$ Torr. An electron beam may be used as the heating means, and pellets obtained by compacting the mixture powder produced in the third step may be used as the vacuum deposition source.

As compared with the conventional method of producing tellurium oxide compound thin films, the method of producing the $TeO_x$ compound thin film as an optical recording medium in the present invention provides the following features:

1. The uniformity of composition of the $TeO_x$ compound thin film photosensitive layer is extremely enhanced.
2. Since there is only one vacuum deposition source, the structure of the vacuum deposition apparatus is simple. Further, the source itself is a sintered body (a solid body) which is easy to handle and provides good workability.
3. By mass producing sintered bodies, differences of quality are eliminated among the manufacturing lots of the optical recording media, assuring reproducibility.

In addition, containing additives within the $TeO_x$ compound thin film having the features described in paragraphs 1-3 is achieved, so that erasable optical information recording thin films may be easily obtained.

While the novel features of the invention are set forth with particularly in the appended claims, the invention, both as to organization and content, will be better understood and appreciated, along with other objects and features thereof, from the following detailed description taken in conjunction with the drawings.

DETAILED DESCRIPTION OF THE INVENTION

In the method of producing an optical recording medium of this invention, a mixture body is used as the vacuum deposition source and this mixture body is obtained by the following steps:

(a) Mixing tellurium dioxide $TeO_2$ and a reducing substance to obtain a mixture;

(b) Making a sintered body by heating the mixture obtained in the previous step and causing part of the $TeO_2$ to react with the reducing substance; and (c) Making a mixture body by mixing additive to the powder obtained by pulverizing the sintered body formed in the previous step.

When vacuum deposition is performed by using the sintered body obtained in steps (a) and (b) as the vacuum deposition source, a pure $TeO_x$ thin film is obtained. When vacuum deposition is performed by using the mixture body obtained in step (c) as the vacuum deposition source, in erasable $TeO_x$ compound thin film is obtained.

According to this invention, the majority of the reduced form of $TeO_2$, resulting from heat treatment, is bonded with part of a reducing metal M to form a compound Te-M, which is combined with unreacted $TeO_2$ and M-O oxidized as a result of reaction, thereby forming a uniform sintered body. At the time of vacuum deposition, $TeO_2$ in this sintered body and Te isolated from the Te-M bonding are simultaneously evaporated, and a thin film of $TeO_x$, where $0<x<2$, is formed on a board.

This method of using the sintered body is free from the phenomenon of spilling of the source, because the reaction is less violent as compared with the process of evaporating while reducing. Besides, since dissociation of Te progresses gradually and at a constant speed, deviation of the chemical composition in the direction of film thickness barely occurs. Moreover, since a large quantity of source is prepared at one time and then necessary portions are dispensed for use, the reproducibility is far better than in other methods, and films having identical characteristics may be obtained. In addition, a thin film of $TeO_x$ resistant to humidity may be obtained.

If when mixing the additive material to the powder obtained by pulverizing the sintered body, additive is dispersed uniformly into the sintered body powder, the additive will be uniformly contained in the $TeO_x$ thin film without obvious deviation in the chemical composition and with less isolation from the $TeO_x$ components during the vacuum deposition process. When the vapor pressure and melting point of the additive material and $TeO_x$ material are selected to be as close to each other as possible, the additive concentration in the $TeO_x$ thin film becomes even more uniform.

Figure 1:
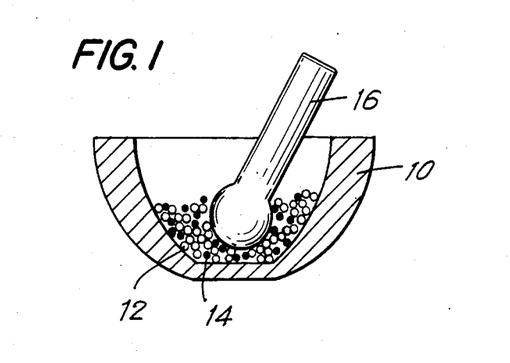
FIG. 1 is a sectional view showing the mixing of the starting materials in the first step of the present invention.
Figure 2:
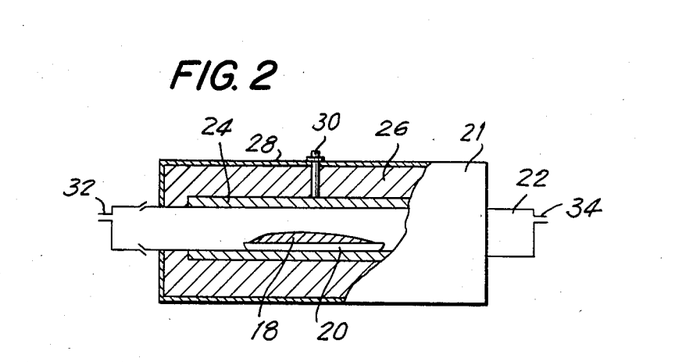
FIG. 2 is a sectional view of an electric furnace used for sintering.
Figure 3:
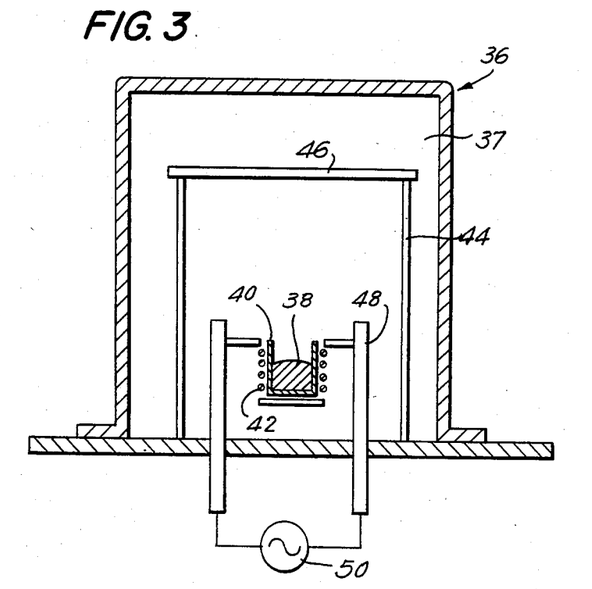
FIG. 3 is a sectional view of an apparatus for producing $TeO_x$ compound thin films by using the sintered body.

FIGS. 1 through 3 illustrate the process of making the sintered body of this invention. FIG. 1 shows a sectional view of a mortar 10 in which powder of tellurium dioxide $TeO_2$ and powder of a reducing substance 14 (to be described later) are placed in the mortar 10 and then well mixed by a pestle 16. A ball mill may be used in this mixing process instead of the mortar and pestle. By mixing the $TeO_2$ powder and reducing substance together with alcohol or acetone, a uniform mixture may be easily obtained. As shown in FIG. 2, the mixed powder 18 is dried, put on a quartz boat 20, and heated in an electric furnace 21. The furnace 21 includes a quartz core tube 22, heater 24, insulator 26, outer wall 28, and thermocouple 30. Heat treatment is effected in an inert gas atmosphere of $N_2$, Ar, or the like. The inlet and outlet for the gas are indicated respectively by numerals 32 and 34. The heat treatment temperature varies with the reducing substance, and ranges approximately from 400° C. to 1,000° C. Reduction reaction in this range produces a clean sintered body. Specifically, at temperatures below 400° C. the reaction does not progress sufficiently and at temperatures over 1,000° C., the Te element is evaporated in a large quantity during heat-treatment, which is also not desirable. One of the causes of this phenomenon is considered to relate to the melting point of the additive, or that of the Te produced in the initial phase of the reaction. Namely, the melting point of the additives mentioned above is, excluding that of Se, S, As, etc., relatively high, such as about 1,000° C. or higher, and therefore, the reaction is difficult to develop at low temperatures. Since the reaction proceeds in a form of melting Te produced in the initial phase of reaction and since the melting point of Te is 450° C., it is estimated that there is substantially no reaction below 400° C. On the other hand, at temperatures over 1,000° C., which is close to the boiling point of Te (1390° C.), it is considered that substantially no Te exists in the sintered body. Particularly, in a range of 600° C. to 700° C., a clean sintered body with less volatile content, good reproducibility and sufficiently advanced reaction can be obtained. In the case of Se, S, As, etc., since the melting point thereof is lower than that of Te, a sufficient reaction is obtained at a temperature of around 400° C.

The reducing substance M maybe at least one element selected from the group consisting of Al, Si, Ti, V, Cd, In, Sn, Sb, Ta, W, Cr, Mn, Fe, Co, Ni, Cu, Zn, Ge, Mo, Bi, Pb, and including other metals or semimetals, such as S, Se, C, etc. The reducing substance M reacts with $TeO_2$ by heat treatment to induce a change as expressed by the formula $mTeO_2 + nM$ $TeM + MO + TeO_2$, where m and n are natural numbers. Specifically, part of $TeO_2$ is reduced by part of reducing substance M to become Te, and M simultaneously deprives Te of oxygen so as to form oxides such as MO, $M_2O_3$ and $MO_2$. At this time, the majority of Te produced by reduction is bonded with the excess unreacted reducing substance M to make compounds such as $M_2Te$, $MTe$, $M_2Te_3$ and $MTe_2$, which compounds are contained in the sintered body. Therefore, the sintered body obtained as a result of heat treatment may be said to be an aggregated body of M-Te alloys, M-O oxides, and $TeO_2$.

Among the reducing substances mentioned above, Cu, Sb, Pb, Al, In, Zn, Bi, Ge, Se, and Cd not only reduced tellurium dioxide at an adequate speed, but also produced a uniform sintered body, and were likely to form a solid solution with the Te produced by reduction. In particular, when Cu, Al, Sb, Pb and In were used, it was found that a solid solution with Te was easily formed so that an extremely uniform sintered body could be obtained.

The mixing ratio $X\alpha$ of the reducing substance is properly in a range of 15 mol% to 80 mol%, that is 15 mol% $\leq X\alpha \leq$ 80 mol%. When the mixing ratio is less than 15 mol%, it was found that reduction does not proceed sufficiently, and the $TeO_x$ thin film evaporated and deposited by using this sintered body was extremely high in oxygen content, had a small coefficient of light absorption, and was insufficient in optical change before and after recording. When the mixing ratio is over 80 mol%, it was found that too much reduction occurs, and the $TeO_x$ thin film evaporated and deposited by using this sintered body was extremely high in Te content, unstable thermally, and was unusable as optical recording film. When the mixing ratio was somewhere between 15 mol% and 80 mol%, a sintered body of an appropriately advanced reduction of $TeO_2$ was obtained, and it was found that a $TeO_x$ thin film could be obtained as the principal material of the optical recording medium.

It is not necessary that the reducing substance be of only one kind as mentioned above. For example, when n kinds of substances are used, supposing the individual mixing ratios to be X1, X2, ..., Xn mol%, the same parameters described above can be used by referring to the total content of $X\alpha = X1 + X2 + ... + Xn$.

FIG. 3 shows a method of forming a $TeO_x$ thin film by using the sintered body obtained as set forth above and a vacuum deposition apparatus 36. The degree of vacuum in the vacuum area 37 may be about $10^{-3}$ Torr to $10^{-7}$ Torr, and, in particular, a strong film with high adhesion is obtained at less than $10^{-5}$ Torr. For example, a sintered body 38 obtained by the above described heat treatment is put in a quartz tube 40, heated from outside by use of coil heater 42, and a $TeO_x$ thin film is formed on a board 46 placed on a support stand 44. An adequate heater temperature should be within the range of 550° C. to 1,000° C., and vacuum deposition speed and film composition may be controlled within this range. The coil heater 42 is connected to an external power source 50 through an electrode 48 and is energized to heat.

The sintered body source 38 is made homogeneous by pulverizing the sintered body, which is mass-produced in the heat treatment step, and using various portions therefrom, so that the reproducibility is enhanced.

Figure 4:
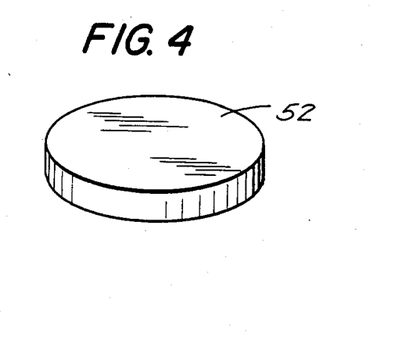
FIG. 4 is a perspective view showing a pellet as the vacuum deposition source.
Figure 5:
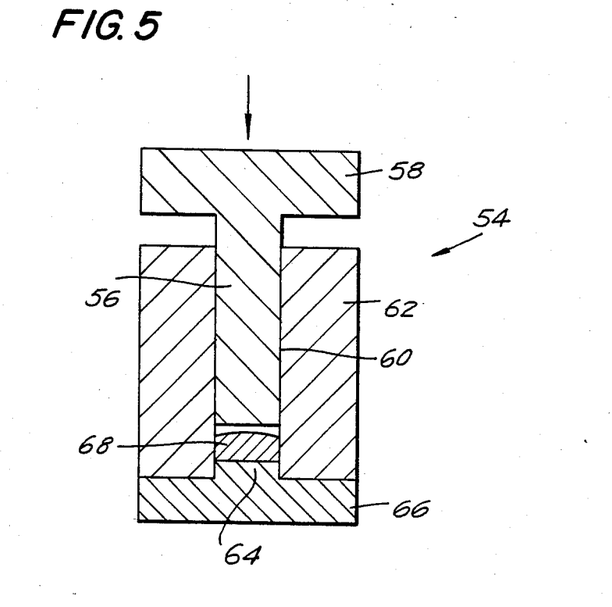
FIG. 5 is a sectional view of a press jig for forming the pellet of FIG. 4.

Instead of heating the entire surface from outside by using the heater 42 mentioned above, it is also possible to heat locally and rapidly by using an electron beam. In this situation, it is easier to heat pellets 52 in disc form, as shown in FIG. 4, which pellets are obtained by compacting the pulverized sintered body as the source. For example, the size of the pellet is about 20 mm in diameter and 3 mm in thickness. But this size may be selected freely, depending on the size of the board to be evaporated on and the thickness of the thin film. The pellets are formed by using a jig 54 as shown in FIG. 5. The jig 54 includes an operational part 58 having a columnar pushing bar 56, a main body 62, having a circular hole 60 in which the pushing bar 56 is inserted, and a bottom 66 having a columnar protruding part 64 which closes the lower end of the circular hole 60. A pulverized powder 68 of sintered body is put in this circular hole 60, pressed and compacted to be formed into pellet shape. The use of an electron beam as the heating method was found to have the following advantages as compared with the heater method:

1. Pellet temperature can be suddenly and locally increased, so that the deviation of the chemical composition is smaller than that obtained by the entire heating by the heater 42;
2. Response is rapid, and control of vacuum deposition speed is facilitated; and
3. Humidity resistance is improved.

The film made by the method of using the sintered body is, as compared with the film made by other methods, denser in film structure and less susceptible to ambient air. In addition, the thin film heated by the electron beam is considered to be further denser in film structure and practically free from the adverse effects of ambient air, so that humidity deterioration is estimated to be small.

A method of manufacturing an erasable $TeO_x$ thin film, where $0 < X < 2$, is described below. An erasable material formed primarily of $TeO_x$ was proposed in our copending U.S. patent application Ser. No. 594,561, and it was found that the following method could be applied to the composition described therein and that a recording thin film of good reproducibility could be obtained. The method uses as the vacuum deposition source the mixture body made up of the sintered body and additives obtained by using the same method of mixing $TeO_2$ and a reducing substance M explained above.

One of the features of this invention is that it is easy to obtain a composition which is uniform in the film thickness direction. This advantage is exhibited even when the vacuum deposition condition for the additive to be added to the sintered body is somewhat different from the vacuum deposition condition for obtaining a $TeO_x$ thin film by indirectly heating the sintered body alone.

Specifically, even if there is a certain difference in the vacuum deposition condition between the $TeO_x$ components and the additives, problems such as the isolation of the additive substance from the $TeO_x$ components during evaporation, such that the additive substance remains in the source as opposed to being contained in the finally obtained $TeO_x$ thin film, do not occur; and a $TeO_x$ thin film containing additives at a desired concentration may be obtained.

This is derived from the characteristic that the O-Te ratio in the vacuum deposited film varies with the heating condition, or more particularly the evaporation rate. Specifically, the composition of the sintered body can be selected according to the characteristics of the additives, by making use of the characteristic that the oxygen O content increases when the evaporation rate is raised while the tellurium Te content increases when the evaporation rate is lowered. More specifically, in the case of Se or S, for example, when the vapor pressure of the additives is high, the mixture is formed by slightly increasing the oxygen content in the composition of the sintered body, and a thin film is formed by lowering the evaporation rate. To the contrary, in the case of Au or Sn, which have a low vapor pressure, the mixture is formed by slightly increasing the tellurium Te content in the composition of the sintered body, and a thin film is formed by raising the evaporation rate. In this process, $TeO_x$ thin films having different additives may be obtained at a same O/Te ratio.

Another factor to be considered is that the mixture added to the sintered body possesses a certain mutual action with the Te in the sintered body during the heating process. For example, it may be considered that the mixture is melted and mixed with Te before being evaporated, and then evaporated as an alloy with Te so as to be dispersed uniformly in the film, since vacuum deposition proceeds in correlation with the Te vacuum deposition quantity. In any event, since the mixture is evaporated uniformly in the $TeO_x$ thin film of the present invention, as it is mixed in the sintered body, this uniform evaporation is not varied by the above described factor.

Additives such as metals, semimetals or nonmetal elements including Ti, V, Ta, Cr, Mo, W, Mn, Fe, Co, Ni, Pt, Cu, Ag, Zn, Cd, Al, In, Tl, Si, Ge, Sn, Pb, As, Sb, Bi, S, Se, and Au may be used either alone or in the form of an oxide, independently or as compounds of substances. The content of the additives in the $TeO_x$ thin film is effective in a range of 0 to 50 mol% as mentioned, for example, in our copending U.S. patent application Ser. No. 594,561 and Japanese Laid-Open Pat. No. 55-28530. A more preferable range is 10 to 30 mol%. In order to realize this, the optimum content B of additive in the vacuum deposition source should be within the range of 10 wt.% to 40 wt.%, i.e., $10 \leq B \leq 40$ wt.%, though it is variable within this range depending on the material chosen for the additives, and vacuum deposition thin films with excellent recording characteristics and stability can be obtained in this range. The additive substance is, at the time of vacuum deposition as described above, taken in the evaporated thin film and bonds to the Te fine particles in $TeO_x$, where $0<x<2$, as an element monomer, for example, so that the Te fine particles may be used to facilitate the occurrence of reversible phase transition. It may be also considered that Te serves to increase the coefficient of thermal diffusion, as disclosed in our copending U.S. patent application Ser. No. 594,561.

With respect to the additives mentioned above, in order to further enhance the uniformity of the evaporated film composition, to prevent the board from being damaged by lowering the evaporation temperature or to satisfy other conditions, materials having a melting point and a vapor pressure as close to either of those of Te or $TeO_2$ as possible should be selected. Materials having a melting point and a vapor pressure between those of Te and $TeO_2$ could be selected too. In this respect, Zn, Cd, In, Tl, Ge, Sn, Pb, As, Sb, Bi, S and Se are particularly effective. Specifically, when Ge, Sn, Se, Bi, In, Zn were used, the vacuum deposition was facilitated and the recording characteristics of the obtained thin film were excellent.

When the content of these additives is selected within a range of 10 wt.% to 30 wt.%, the aforesaid content is achieved, and thin films particularly excelling in erasable property can be obtained as disclosed in our copending U.S. patent application Ser. No. 594,561. At a higher content, however, the erasable property is sacrificed. To the contrary, if the content is too small, sufficient erasable property may not be obtained.

These additives may be used either alone or in the form of an oxide, nitride, halide or carbide, but when added alone, the vacuum deposition was generally easier and the reproducibility of certain characteristics was greater. However, in the tellurium compounds of these additives, as compared to the additives alone, the melting point and vapor pressure are very close to those of the $TeO_x$ compound, where $0<x<2$, evaporated from the sintered body of the principal material, and a vacuum deposition source excelling in stability and reproducibility may be obtained. As a result, vacuum deposition thin film obtained from this source was found to be homogeneous in the composition of the film as compared with the film obtained by using the additive substance alone. In addition, the additive substances which are somewhat hard to use alone have been found to be sufficiently usable when bonded with tellurium. For instance, the following compounds are usable: Ti-Te, V-Te, Ta-Te, Cr-Te, Mo-Te, W-Te, Mn-Te, Fe-Te, Co-Te, Ni-Te, Pt-Te, Cu-Te, Ag-Te, Zn-Te, Cd-Te, Al-Te, In-Te, Tl-Te, Si-Te, Ge-Te, Sn-Te, Pb-Te, As-Te, Sb-Te, Bi-Te, S-Te, Se-Te, Au-Te. Further, when Te compounds such as Ge-Te, Sn-Te, In-Te, Pb-Te, Sb-Te, Se-Te, Zn-Te, Al-Te, Bi-Te, Cu-Te and Au-Te were used either alone or in combination, vacuum deposition thin films having extremely excellent recording and erasing properties were obtained.

These Te compounds may also be used in combinations of the aforesaid single elements or compounds thereof. For example, vacuum deposition sources combining Ge with Sn-Te, In-Te, Pb-Te, Sb-Te, Se-Te, Zn-Te, Al-Te, Bi-Te, Cu-Te, Au-Te, etc. were found to produce erasable optical recording thin films having extremely excellent stability and reproducibility characteristics.

In the composition of the mixture, the ratio by weight of the additive preferably should be 10 wt.% to 40 wt.%. When a tellurium compound was used, erasable vacuum deposition films were obtained in a relatively wide range of content, and the characteristics were not significantly changed if the content was low, and this method was found to be extremely effective for enhancing reproducibility.

The use of Ge to raise the crystallization temperature of Te in TeO$_x$ thin film, where $0<x<2$, and to enhance the thermal stability of film is disclosed in the Proceedings of 1983 Japan Display, p. 46. In addition, Ge, added to the sintered body together with a tellurium compound, was found to be contained in the film at a concentration according to the concentration of addition, and this concentration was found to be reproduced in the other films formed from the mixture. For example, when Ge is used together with Sn-Te, In-Te, Pb-Te, Sb-Te, Se-Te, Zn-Te, Al-Te, Bi-Te, Cu-Te, Au-Te, etc., stable recording thin films were obtained with good reproducibility when the Ge content B was in a range of 0 to 10 wt.%, that is, $0 \leq B \leq 10$ wt.%, or the content of about 0 to 10 mol% in the film as disclosed in our co-pending U.S. patent application Ser. No. 594,561. When the addition of Ge exceeded 10%, it was difficult to crystallize the film with a short pulse.

The method of forming a TeO$_x$ thin film containing an additive by using the thus obtained mixture as a vacuum deposition source is applicable to the system shown in FIG. 3. The degree of vacuum in the vacuum area 37 may be about $10^{-3}$ Torr to $10^{-7}$ Torr. Particularly, with a vacuum below $10^{-5}$ Torr a strong film of high adhesion is obtained. For example, the mixture is put in a quartz container 40 and heated from outside by a coil heater 42, and a thin film of TeO$_x$ containing the additive substance is evaporated and formed on a board 46 placed on a support stand 44. A proper heater temperature is somewhere between 500° C. and 1,000° C., and the evaporation speed and film composition may be controlled in this range. The coil heater 42 is connected to an external power source 50 through electrodes 48, and is energized to heat.

The mixture vacuum deposition source, which is prepared by producing a large quantity of mixture, portions of which are then dispensed as necessary, is homogeneous, and contributes to the enhancement of reproducibility.

By annealing the mixture in an inert gas of N$_2$, Ar or the like, affinity among components is improved, and accidents such as the sudden boiling in vacuum deposition may be eliminated. However, if the annealing temperature exceeds the sintering temperature of the main material, the characteristics of the sintered body will be varied. Therefore, the annealing temperature should be set somewhat lower than the firing temperature.

With respect to the method of heating at the time of vacuum deposition, instead of the method of heating the entire surface from the outside by using a heater as described above, it is also possible to heat locally and quickly by using an electron beam. In this case, it is easier to heat the source if it is in a pellet form, for example as shown in FIG. 4, and this may be achieved by compacting the powder of mixture body and forming it into a disc shape. As compared with the heater method, the electron beam method has been found to bring about the following advantages:

1. It is possible to elevate the pellet temperature suddenly and locally, and the deviation in composition is less than that in the heater method;
2. Since the response is quick, it is easier to control the evaporation speed; and
3. Humidity resistance is improved.

The film made by the method of using the sintered body as the main material is denser in film structure than the film made by other methods, and is therefore considered to be less susceptible to ambient air. In addition, the thin film heated by the electron beam is further denser and more homogeneous in film structure and is practically free from the effects of ambient air, so that deterioration by humidity is considered to be inconsequential.

The present invention is further described below in the following embodiments.

Embodiment 1

Using TeO$_2$ powder and Cu powder as the starting materials, 111.72 grams of TeO$_2$ (about 0.7 mol) and 19.68 grams of Cu (about 0.3 mol) were mixed together with a small quantity of alcohol, according to the methods described above. A hundred grams of the thus obtained mixture powder was put on a quartz boat and heated in an electric furnace. A specimen was put in a furnace core tube, and while passing N$_2$ gas at a rate of about 2 liters/hour, the furnace temperature was raised to reach 700° C. in about 30 minutes. After holding that state for about two hours, the specimen was drawn out to the low temperature zone of the furnace to be cooled. About an hour later, when the specimen was taken out of the furnace, a dark brown glass-like solid material, i.e., a sintered body, was obtained.

Figure 7:
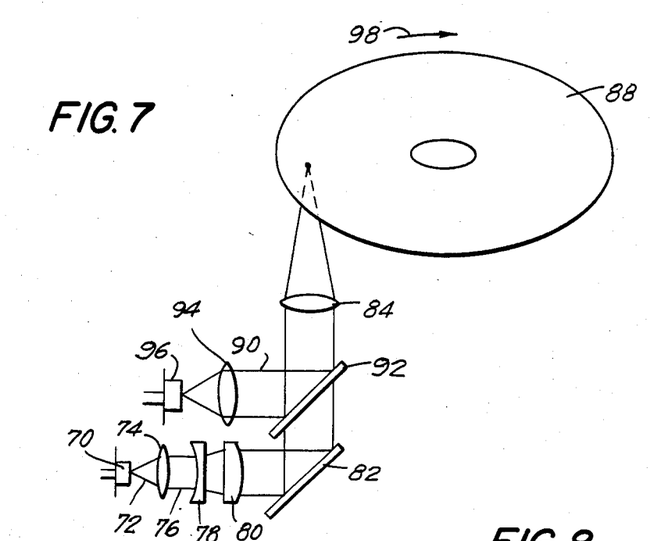
FIG. 7 is a schematic diagram of an apparatus for recording and reproducing information signals on an optical disk produced by the method of the present invention.

This solid material was taken out of the quartz boat, and part of it was evaporated in the vacuum deposition apparatus shown in FIG. 3. At a degree of vacuum of $1 \times 10^{-5}$ Torr and a heater temperature of 700° C., about 200 mg of a small lump of the sintered body was put in a quartz container and heated. As a result, a slightly yellowish brown transparent TeO$_x$ thin film was formed on an acrylic resin board, the film having a thickness of about 1,200 Å. When this thin film was irradiated with a semiconductor laser beam of wavelength ($\lambda$) of 830 nm, focusing through an optical system as shown in FIG. 7 and described more fully hereinbelow, the illuminated part was found to be darkened.

Embodiment 2

In accordance with and further to the experiments of Embodiment 1, the mixing ratio $\alpha$ of Cu to the TeO$_2$ powder was varied through the range of 0 to 100 mol%, at 5 mol% increments and dark brown uniform sintered bodies were obtained in the mixing ratio range of 0 to 90 mol%. When these sintered bodies were evaporated, as in Embodiment 1, and when the mixing ratio $\alpha$ was in a range of 0 to 15 mol%, i.e., $0 \leq \alpha \leq 15$ mol%, the optical density of the obtained thin films was extremely small, and notable density change was not obtained by irradiation with a semiconductor laser beam. When the mixing ratio $\alpha$ was over 80 mol%, i.e., $\alpha > 80$ mol%, the optical density increased, but the film was unstable, and the evaporated part was a brown transparent film which shortly changed at room temperature until becoming an opaque, slightly metallic, black film. When the mixing ratio $\alpha$ was within the range of 15 mol% to 80 mol%, i.e., $15 \leq \alpha \leq 80$ mol%, a stable yellowish brown transparent film was obtained, and it was darkened when irradiated with a semiconductor laser beam.

Figure 10:
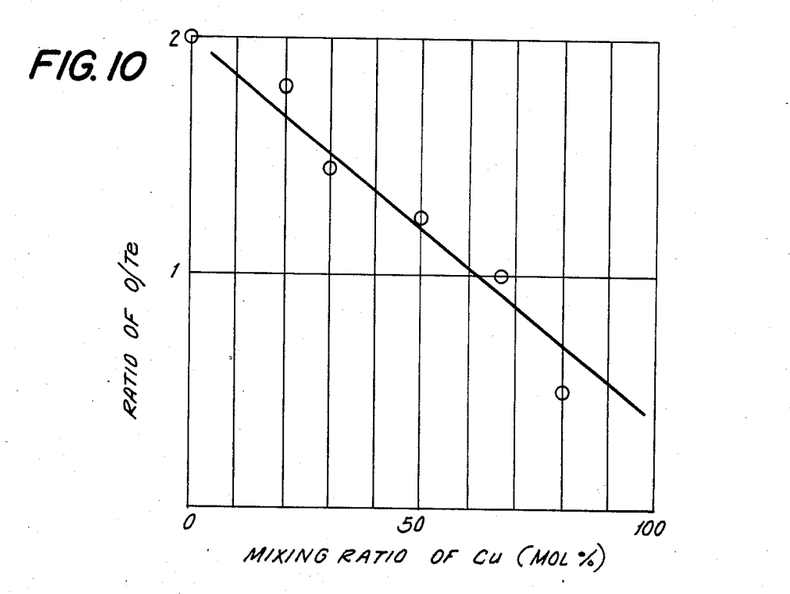
FIG. 10 shows the change in the O/Te ratio with respect to the content of Cu, when the $TeO_x$ compound thin film is formed by using the sintered body produced by varying the Cu content added to $TeO_2$ in the heat treatment step.

As a result of composition analysis by use of Auger electron spectral method, the deviation of composition in the film thickness direction was practically none and the composition was homogeneous, and it was found that the O/Te value decreased in the direction of a high mixing ratio, as shown in FIG. 10.

Embodiment 3

As a result of an experiment similar to that performed in Embodiment 2, utilizing a mixing ratio range of 0 to 100 mol% but using Al instead of Cu, black sintered bodies were obtained in the mixing ratio range of 10 mol% to 80 mol%. When these sintered bodies were evaporated as in Embodiment 1, the optical density of the obtained thin films was extremely small in the mixing ratio range of 0 to 20 mol%, and notable density change was not obtained by irradiation with a semiconductor laser beam. When the mixing ratio was over 60 mol%, the optical density was raised, but the film was unstable and changed from dark to black color at room temperature. When the mixing ratio $\alpha$ was in a range of 20 mol% to 60 mol%, i.e., 20 mol% $\leq \alpha \leq$ 60 mol%, stable yellowish brown films were obtained, and they were darkened when irradiated with a semiconductor laser beam. As a result of composition analysis by Auger electron spectral method, it was found that the O/Te ratio varied predictably with the additional concentration of Al.

Embodiment 4

Instead if Cu powder, Al, Si, Ti, V, Cd, In, Sn, Sb, Ta, W, Cr, Mn, Fe, Co, Ni, Zn, Ge, Mo, S, Se, and C powder were used, and individual sintered bodies were obtained in the experiments described in Embodiments 1 and 2. Among them, when Sb, Pb, Al, In, Zn, Bi, Ge, Se, and Cd were used, glass-like homogeneous sintered bodies with black, yellowish brown, black, dark brown, black, grayish brown, yellowish brown, reddish brown, and grayish brown colors were obtained respectively. When Al, Sb, Pe, In were used, homogeneous glass-like sintered bodies were obtained with a wide range of mixing ratios, similar to the Embodiments where Cu was used. But when Si, C, Mn were used, slightly non-homogeneous sintered bodies were obtained.

These sintered bodies were heated in a vacuum, and individual thin films of $TeO_x$, where $0 < x < 2$, were obtained.

Embodiment 5

By using plural reducing substances M, a method to control the characteristics of the $TeO_x$ thin film was studied. The reducing substances mentioned in Embodiment 4 are not identical in reducing ability, but are divided into those which are oxidized and react violently, having a relatively high reducing ability, such as $MO_2$ and $M_2O_3$, and others which are slightly oxidized and react mildly, having a relatively low reducing ability, such as MO and $M_2O$. Therefore, by combining these two types, it is possible to control the characteristics of the $TeO_x$ thin film. As a result of the experiments of embodiment 4, it was found that Al and Cu were respective representatives of the former group and latter group.

Accordingly, Al and Cu were mixed with $TeO_2$ at various mixing ratios, the mixtures were heated for 2 hours at 700° C. in an $N_2$ gas atmosphere, and dark brown sintered bodies were obtained. Using 200 mg of each sintered body, and heating in a vacuum of $10^{-5}$ Torr by use of a heater, films with characteristics corresponding to slight changes in the mixing ratio were obtained. The results were further examined by irradiation with a semiconductor laser, and thin films particularly suited to recording optical information were obtained at the Al mixing ratio $\alpha_1$ and the Cu mixing ratio $\alpha_2$ of 15 mol% $\leq \alpha_1 \leq$ 50 mol% and 20 mol% $\leq \alpha_2 \leq$ 60 mol%, or, when the two elements are mixed at the same time, 50 mol% $\leq \alpha_1 + \alpha_2 \leq$ 80 mol%.

Embodiment 6

Among the sintered bodies obtained in Embodiment 5, a product having a starting composition of $(TeO_2)_{30}(Al)_{30}(Cu)_{40}$ mol% was selected, and pulverized into powder form. About 2 grams of this powder was weighed, pressed and shaped into a pellet measuring 20 mm in diameter and about 1.5 mm in thickness by use of the press jig shown in FIG. 5. The press pressure was 5 tons/cm².

When a thin film was evaporated and deposited on a pyrex board by use of the pellet and heating with the heater shown in FIG. 3 or heating with an electron beam, slightly yellowish brown thin films of $TeO_x$ were obtained. When these two films were put in a thermostatic oven controlled at 50° C. and 90% relative humidity, and changes in the transmission were measured at regular intervals, curb b of the thin film heated by the electron beam had fewer changes than curb a of the thin film heated by the heater shown in FIG. 6, and the former film was found to be less susceptible to humidity and much more stable.

Embodiment 7

An optical disk was experimentally formed on a PMMA (polymethylmethacrylate) resin board of 1.1 mm in thickness and 200 mm in diameter, the board rotating at a speed of 150 rpm, by evaporating and depositing a thin film of $TeO_x$, where $0 < x < 2$, having a thickness of about 1,200 Å at a speed of 3 Å/sec, through the use of a pellet having a starting composition of $(TeO_2)_{30}(Al)_{30}(Cu)_{40}$ and an electron beam heating system as in Embodiment 6.

Using this disk, a test recording was conducted in a system such as that shown in FIG. 7. Specifically, light 72 leaving the semiconductor laser 70 was changed to quasi-parallel light 76 by a first lens 74, shaped in a round shape by a second lens 78, and returned to a parallel light by a third lens 80, which parallel light was then converged into a spot light having a wavelength limit of about 0.8 μm by use of a fourth lens 84 and a half mirror 82. The recording film on the disk 88 irradiated with this circular spot light is darkened to record information. Thus, by modulating the semiconductor laser, information signals can be recorded on the disk.

A photosensitive diode 96 then detects the signals recorded on the disk by receiving the reflected light 90 from the disk surface 88 through a half mirror 92 and a lens 94.

When the semiconductor laser was modulated at a single frequency of 5 MHz and the disk surface, rotating in the direction of 98 at a speed of 1800 rpm, irradiated with the laser beam having an irradiating power of 8 mW, the information was recorded. The C/N ratio was measured by use of a spectral analyzer, and 60 dB was obtained.

Embodiment 8

Powder obtained by pulverizing the solid material produced in Embodiment 1, and Sn powder were mixed at ratios, by weight, of 0, 5, 10, 20, 30, 40, and 50%, and thin films were evaporated and deposited by use of the mixtures in a system shown in FIG. 1. At a degree of vacuum of $1 \times 10^{-5}$ Torr and a heater temperature of 750° C., each powder of 300 mg was put in a quartz tube and heated, and yellowish brown transparent thin films were formed on an acrylic resin board with a film thickness of 800 Å to 1,200 Å. When the thin film was irradiated with a semiconductor laser beam at a wavelength of 830 nm for 1 μsec at a low intensity of about 1 mW/μm$^2$, by converging slightly off focus through an optical system, the film was darkened. When the darkened area was reirradiated with the same semiconductor laser beam on focus for about 50 μsec at a high intensity of about 5 mW/μ$^2$, the darkened area returned to the original yellowish brown color in the films whose Sn content was in a range of 5 wt.% to 40 wt.%. However, if the Sn content was less than 5 wt.%, the film did not return to the original state completely, and if the content was over 40 wt.%, there was no reversibility at all. As a result of examinations of transmission and reflectivity of the films after recovery, reversible changes were repetitively observed when the Sn content B was in the range of 10 wt.% to 30 wt.%, i.e., 10 wt.%$\leq$B$\leq$30 wt.%.

Embodiment 9

Among the sintered bodies obtained in Embodiment 5, those whose starting composition was (TeO$_2$)$_{30}$(Al)$_{30}$(Cu)$_{40}$ mol% were pulverized to a fine powder. The powder was mixed with Ti, V, Ta, Cr, Mo, W, Mn, Fe, Ni, Pt, Cu, Ag, Zn, Cd, Al, In, Tl, Si, Ge, Sn, Pb, As, Sb, Bi, S, and Se as additives, either alone or in the form of an oxide, in a range of 0 to 50 wt.%, at 5 wt.% increments, and an experiment similar to that described in Embodiment 2 was conducted. As a result, erasable yellowish brown thin films were obtained in the content range B of 10 wt.% to 40 wt.% (10 wt.%$\leq$B$\leq$40 wt.%) for independent additives, and 20 wt.% to 60 wt.% (20 wt.%$\leq$B$\leq$60 wt.%) for oxides. Further, when Zn, Cd, In, Tl, Ge, Sn, Pb, As, Sb, Bi, S, and Se were used alone, the affinity for the sintered body, the main material of the source, was good, and a uniform vacuum deposition film was obtained at a low heater temperature at the time of vacuum deposition. In particular, when using the vacuum deposition sources mixed with Ge, Sn, Bi, In, Zn, the heater temperature was sufficient at 400° C. to 700° C., and vacuum deposition at high reproducibility was easily performed. When the additive content B was in a range of 10 wt.% to 30 wt.% (10 wt.%$\leq$B$\leq$30 wt.%), thin films excelling in respective characteristics were obtained.

To the contrary, when elements of relatively low vapor pressure such as Ti, Fe, Co, Ta, Ni, Pt, W, and Cr were used, it was difficult to form a uniform film.

Embodiment 10

Additives formed of tellurium compounds of various elements were studied. Sintered bodies having a starting composition of (TeO$_2$)$_{30}$(Al)$_{30}$(Cu)$_{40}$ mol% were used by sintering, in the same method as that in Embodiment 1.

TeSn was used as the tellurium compound and was mixed well with the sintered body at a mixing ratio α of 0 to 50 wt.% (0<α<50 wt.%). About 2 grams of this powder was weighed, pressed and formed into a pellet measuring 20 mm in diameter and about 1.5 mm in thickness, by using a press jig. The press pressure was 5 tons/cm$^2$. This pellet was heated with an electron beam of 5 kW output in a vacuum of 1×10$^{-5}$ Torr in the system shown in FIG. 3, and a very homogeneous thin film was formed on an acrylic resin board, the film having a thickness of about 1,000 Å at a speed of 10 Å/second. When the characteristics of this thin film were measured in an optical system by varying the power of the illuminating light and irradiation time, by use of a semiconductor laser, thin films excelling in repetitive performance were obtained over a wide range of additive content B, specifically 10 wt.% to 40 wt.% (10 wt.%$\leq$B$\leq$40 wt.%). When the content was below 10%, a sufficient erasable characteristic was not obtained, and when it was over 40%, a film was obtained which was found to have a low degree of stability.

Embodiment 11

The same experiment performed in Embodiment 10 was conducted using Ge-Te, Sn-Te, In-Te, Pb-Te, Sb-Te, Se-Te, Zn-Te, Al-Te, Bi-Te, and Cu-Te as tellurium compounds, and vacuum deposition sources which were easy to evaporate, had good reproducibility characteristics and were capable of producing erasable films, were obtained in the same addition range of 10 wt.% to 40 wt.%.

Embodiment 12

Figure 6:
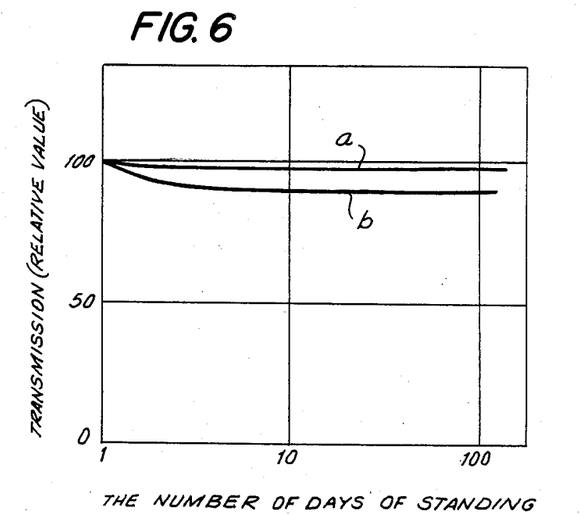
FIG. 6 illustrates the difference in transmission due to differences in the vacuum deposition method of the $TeO_x$ compound thin film.

Differences in characteristics due to differences in heating method was also observed. In Embodiment 10, the mixing ratio of TeSn was selected at 20 wt.%, and some of the mixture was heated by the heater shown in FIG. 3 and some by an electron beam. As a result, apparently identical slightly dark thin films were evaporated and deposited on a pyrex board. When these two films were put in a thermostatic oven controlled at 50° C. and 90% relative humidity and changes in the transmission were measured at regular intervals, it was found, as shown in FIG. 6, that film heated by the electron beam had smaller changes in transmission, was less susceptible to humidity, and was more stable than the film heated by the heater of FIG. 6.

In the next Embodiments, a method of using plural additive substances to precisely control the characteristics of the recording thin film composed mainly of TeO$_x$ is studied. The additives mentioned in Embodiments 9, 11, etc. are not constant in their vacuum deposition characteristics or behavior in the film. For instance, there are certain substances which act to raise the phase transition temperature, and others which act to shorten the irradiation time required for phase transition.

Embodiment 13

Using Sn-Te as the component to enhance the erasing function, and Ge as the component to promote the stability of film, vacuum deposition was performed as in Embodiment 9, varying the content of each additive, and erasable and stable thin films were obtained with the additive content having a range of 10 wt/% to 40 wt/% (10 wt.%$\leq$B$\leq$40 wt.%). In particular, in the range of 15 wt.% to 30 wt.% (15 wt.%$\leq$B$\leq$30 wt.%), the repetitive performance was very good, and recording and erasing of 100,000 times was confirmed.

Figure 8:
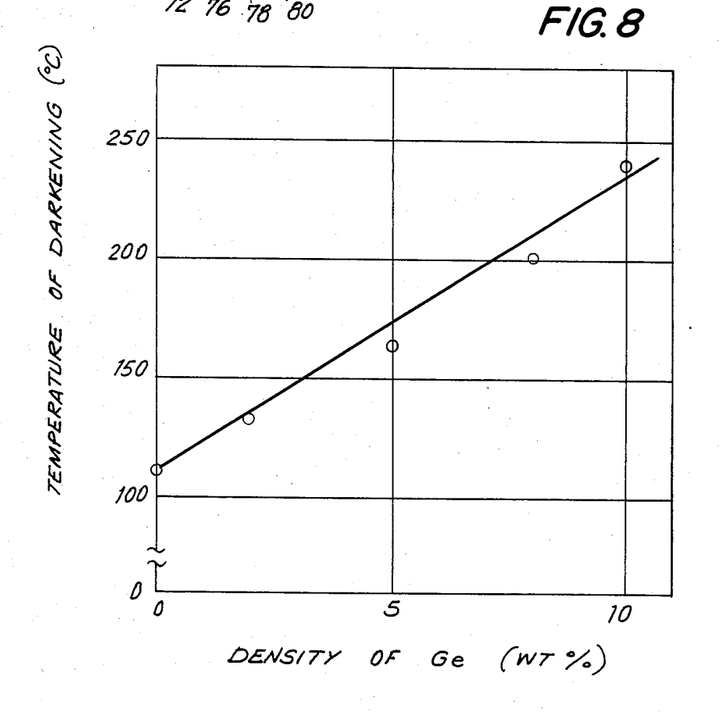
FIG. 8 is a graph showing the difference in the temperature of darkening due to differences in the density of Ge in a $TeO_x$ compound thin film.

FIG. 8 shows the changes in the darkening temperature at various contents of Ge with the TeSn content fixed at 20 wt.%. When the Ge content was 8 wt.%, the transition temperature shfted to a considerably high 200° C. and a large laser power was required. When the Ge content was 10 wt.%, the temperature climbed higher to 240° C., such that the transition was difficult in a film containing more Ge.

Embodiment 14

The SnTe used in Embodiment 13 was replaced by InTe, PbTe, $Sb_2Te_3$, SeTe, ZnTe, $Al_2Te_3$, $Bi_2Te_3$, and $Cu_2Te$, and vacuum deposition was performed. The same results were obtained as those in Embodiment 13.

Embodiment 15

Figure 9:
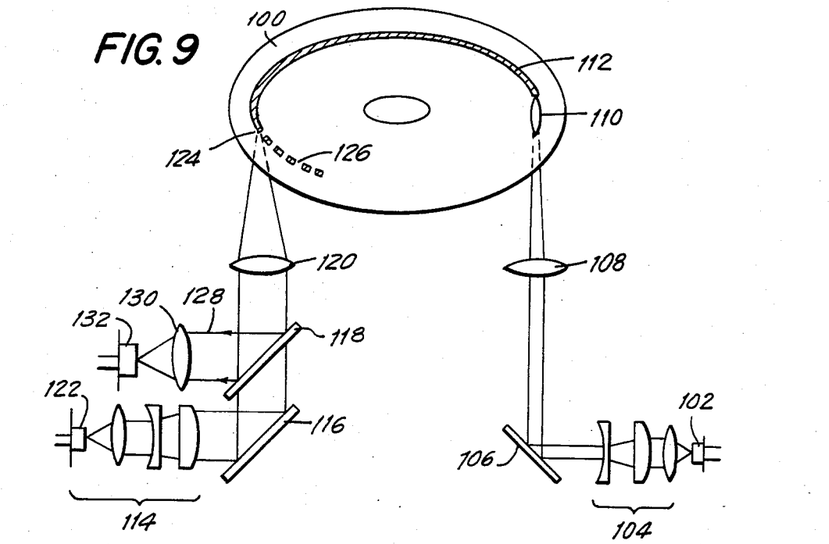
FIG. 9 is a schematic diagram of an apparatus for recording, reproducing and erasing information signals on an optical disk produced by the method of the present invention.

Employing the vacuum deposition method of the present invention, a disk for optical recording was experimentally produced. Recording and erasing was tested in a system as shown in FIG. 9. First, a disk surface 100 rotating at a speed of 1,800 rpm was irradiated with light from a semiconductor laser 102 focused to a laser spot light 110 defined in the half-value intensity distribution of 10 μm in the disk rotating direction and 1 μm in the radial direction with a total power of 10 mW. The laser spot light 110 was formed by use of lens system 104, mirror 106 and lens 108, and the illuminated area on the disk 100 was darkened, forming a black track 112.

Next, light from another semiconductor laser 122 was converged into a circular spot light 124 of 0.8 μm reduced to the limit of its wavelength 830 μm through a lens system 114, mirror 116, half mirror 118, and lens 120. While modulating this laser spot light 124 at a single frequency of 5 MHz, the obtained black track 112 was irradiated with light having a total power of 8 mW, and the illuminated area on the disk 100 returned to its original state, such that a bit group 126 of recorded signals was formed.

For detection of the recorded signals, the reflected light 128 from the disk was focused by a lens system 130 for reproduction, and was fed into a detector 132 to be read. When the C/N was measured by using a spectral analyzer, 58 dB was obtained.

The disk 100 was then irradiated with the first slender laser spot light 110 and the recorded bit 126 was erased, and no signal could be detected by the spectral analyzer.

While specific embodiments of the invention have been illustrated and described herein, it is realized that modifications and changes will occur to those skilled in the art. It is therefore to be understood that the appended claims are intended to cover all modifications and changes as fall within the true spirit and scope of the invention.

What is claimed:

1. A method of producing an optical recording medium comprising the steps of:
   (a) mixing tellurium dioxide $TeO_2$ and a reducing substance capable of reducing said $TeO_2$;
   (b) forming a sintered body containing part of said $TeO_2$ in reduced form by heat-treating the mixture obtained in step (a) to cause said part of $TeO_2$ to react with and be reduced by said reducing substance; and
   (c) evaporating and depositing tellurium compound optical recording thin film on a support by using said sintered body obtained in step (b) as a vacuum deposition source in cooperation with a chemically stable container.

2. The method of claim 1, wherein a mortar is used in step (a) to mix said tellurium dioxide $TeO_2$ and said reducing substance.

3. The method of claim 2, wherein a ball mill is used to mix said tellurium dioxide and said reducing substance.

4. The method of claim 1, wherein an electric furnace is used for heat treating the mixture in step (b), and the mixture obtained in step (a) is dried, placed on a quartz boat, put into said electric furnace, and heated in an inert gas atmosphere to form said sintered body.

5. The method of claim 4, wherein the heating temperature is set in a range of 400° C. to 1,000° C.

6. The method of claim 5, wherein the heating temperature is set in a range of 600° C. to 700° C.

7. The method of claim 1, wherein said reducing substance is at least one selected from the group consisting of Al, Si, Ti, V, Cd, In, Sn, Sb, Ta, W, Cr, Mn, Fe, Co, Ni, Cu, Zn, Ge, Mo, Bi, Pb, S, Se, and C.

8. The method of claim 1, wherein said reducing substance is represented as M and said sintered body is an aggregated body of at least M-Te alloy, M-O oxide and $TeO_2$.

9. The method of claim 1, wherein said reducing substance is at least one selected from the group consisting of Cu, Sb, Pb, Al, In, Zn, Bi, Ge, Se and Cd.

10. The method of claim 1, wherein said reducing substance is at least one selected from the group consisting of Cu, Al, Sb, Pb and In.

11. The method of claim 1, wherein the mixing ratio $\alpha$ of the reducing substance is set in a range of 15 mol% $\leq \alpha \leq$ 80 mol%.

12. The method of claim 1, wherein a vacuum deposition apparatus is used in step (c), and said sintered body is put in a quartz container, heated by heating means, and a tellurium compound optical recording thin film is evaporated and deposited on said support.

13. The method of claim 12, wherein the heating means includes a heater.

14. The method of claim 12, wherein an electron beam is used as the heating means, and at least one pellet is used as said vacuum deposition source, said pellet formed by pressing and compacting the powder of said pulverized sintered body.

15. The method of claim 12, wherein the degree of vacuum of the vacuum deposition apparatus is in the range of $10^{-3}$ Torr to $10^{-7}$ Torr.

16. The method of claim 15, wherein the degree of vacuum of the vacuum deposition apparatus is less than $10^{-5}$ Torr.

17. The method of claim 1, wherein Cu is selected as said reducing substance and its mixing ratio $\alpha$ is set in a range of 15 mol% $\leq \alpha \leq$ 80 mol%.

18. The method of claim 1, wherein Al is selected as the reducing substance and its mixing ratio $\alpha$ is set in a range of 20 mol% $\leq \alpha \leq$ 60 mol%.

19. The method of claim 1, wherein Cu and Al are selected as the reducing substance and are mixed simultaneously.

20. The method of claim 19, wherein the mixing ratios $\alpha_1$, $\alpha_2$ of Al and Cu are set respectfully in the range of 15 mol% $\leq \alpha_1 \leq$ 50 mol%, 20 mol% $\leq \alpha_2 \leq$ 60 mol%, and 50 mol% $\leq \alpha_1 + \alpha_2 \leq$ 80 mol%.

21. A method of producing an optical recording medium comprising the steps of:
   (a) mixing tellurium dioxide $TeO_2$ and a reducing substance capable of reducing said $TeO_2$;
   (b) forming a sintered body containing part of said $TeO_2$ in reduced form by heating the mixture obtained in step (a) to cause said part of $TeO_2$ to react with and be reduced by said reducting substance;
   (c) mixing the sintered body obtained in step (b) with an additive material; and (d) evaporating and depositing a tellurium compound optical recording thin film on a suppport by using the mixture obtained in step (c) as a vacuum deposition source in cooperation with a chemically stable container.

22. The method of claim 21, wherein Ti, V, Ta, Cr, Mo, W, Mn, Fe, Co, Ni, Pt, Cu, Ag, Zn, Cd, Al, In, Tl, Si, Ge, Sn, Pb, As, Sb, Bi, S, Se, Au are used as said additive material either alone or in the form of an oxide, independently or as compounds of the substances.

23. The method of claim 21, wherein the content B of the additive material is set in a range of $10 \text{ wt.}\% \leq B \leq 40 \text{ wt.}\%$.

24. The method of claim 21, wherein the additive material is at least one element selected from the group consisting of Zn, Cd, In, Tl, Ge, Sn, Pb, As, Sb, Bi, S and Se.

25. The method of claim 21, wherein the additive material is at least one element selected from the group consisting of Ge, Sn, Bi, In and Zn.

26. The method of claim 21, wherein the content B of the additive material is set in a range of $10 \leq B \leq 30$ wt.%.

27. The method of claim 21, wherein the additive material is at least one compound selected from the group consisting of Ti-Te, V-Te, Ta-Te, Cr-Te, Mo-Te, W-Te, Mn-Te, Fe-Te, Co-Te, Ni-Te, Pt-Te, Cu-Te, Ag-Te, Zn-Te, Cd-Te, Al-Te, In-Te, Tl-Te, Si-Te, Ge-Te, Sn-Te, Pb-Te, As-Te, Sb-Te, Bi-Te, S-Te, Se-Te, and Au-Te.

28. The method of claim 21, wherein the additive material is any Te compound selected from the group consisting of Ge-Te, Sn-Te, In-Te, Pb-Te, Sb-Te, Se-Te, Zn-Te, Al-Te, Bi-Te, Cu-Te, and Au-Te used either alone or in combination.

29. The method of claim 21, wherein the vacuum deposition source is at least one selected from the group consisting of Sn-Te, In-Te, Pb-Te, Sb-Te, Se-Te, Zn-Te, Al-Te, Bi-Te, Cu-Te, and Au-Te, combined with Ge.

30. The method of claim 29, wherein the content B of the additive material Ge is set in a range of $0 < B \leq 10$ wt.%.

31. The method of claim 21, wherein a vacuum deposition apparatus is used in step (d), and the mixture obtained in step (c) is put in a quartz container, heated by a heating means, and a tellurium compound optical recording film which includes said additive material is evaporated and deposited on said support.

32. The method of claim 31, wherein a coil heater is used as the heating means, and the heater temperature is set in the range of 500° C. to 1,000° C.

33. The method of claim 31, wherein the degree of vacuum of the vacuum deposition apparatus is in the range of $10^{-3}$ Torr to $10^{-7}$ Torr.

34. The method of claim 33, wherein the degree of vacuum of the vacuum deposition equipment is less than $10^{-5}$ Torr.

35. The method of claim 31, wherein an electron beam is used as the heating means, and pellets compacted from the powder of the mixture obtained in step (c) are used as the vacuum deposition source.

36. A method of producing an optical recording medium comprising the steps of:
(a) mixing tellurium dioxide $TeO_2$ and a reducing substance capable of reducing said $TeO_2$;
(b) obtaining a sintered body containing part of the $TeO_2$ in reduced form by heating the mixture obtained in step (a) to cause said part of $TeO_2$ to react with and be reduced by said reducing substance;
(c) obtaining a formed body by pulverizing and forming the sintered body obtained in step (b); and
(d) evaporating and depositing a tellurium compound optical recording thin film on a support by using the body formed in step (c) as a vacuum deposition source in cooperation with a chemically stable container.

37. A method of producing an optical recording medium by mixing at least one element selected from the group consisting of Al, Si, Ti, V, W, Cr, Mn, Fe, Co, Ni, Cu, Zn, Ge, Mo, Cd, In, Sn, Sb, Ta, Bi, Pb, S, Se, C with tellurium dioxide for use as a reducing substance on said tellurium dioxide, heating in a form of $TeO_{2\ 100-x_\alpha}M_{x_\alpha}$, where $0 < x_\alpha < 80$ mol% and M is an aggregated body of reducing substances $M_1, M_2 \ldots, M_n$; $x_1 + x_2 + \ldots + x_n = x_\alpha$, to obtain a sintered body containing part of said tellurium dioxide in reduced form, heating this sintered body in cooperation with a chemically stable container to form a tellurium compound thin film on a support as an optical recording medium.

38. A method of producing an optical recording medium by mixing at least one element selected from the group of metals or semimetals consisting of Al, Si, Ti, V, W, Cr, Mn, Fe, Co, Ni, Cu, Zn, Ge, Mo, Cd, In, Sn, Sb, Ta, Bi and Pb, or from the group consisting of S, Se, C with tellurium dioxide for use as a reducing substance on said tellurium dioxide, heating in a form of $TeO_{2\ 100-x_\alpha}M_{x_\alpha}$, where $0 < x_\alpha < 80$ mol% and M is an aggregated body of reducing substances $M_1, M_2 \ldots, M_n$; $x_1 + x_2 + \ldots x_n = x_\alpha$, to obtain a sintered body containing part of said tellurium dioxide in reduced form, pulverizing and forming this sintered body, and heating the obtained formed body in cooperation with a chemically stable container to form a tellurium compound thin film on a support for use as an optical recording medium.

39. A method of producing an optical recording medium by mixing at least one element selected from the group of metals or semimetals consisting of Al, Si, Ti, V, W, Cr, Mn, Fe, Co, Ni, Cu, Zn, Ge, Mo, Cd, In, Sn, Sb, Ta, Bi and Pb, or from the group consisting of S, Se, C with tellurium dioxide for use as a reducing substance on said tellurium dioxide, heating in a form of $TeO_{2\ 100-x_\alpha}M_{x_\alpha}$, where $0 < x_\alpha < 80$ mol% and M is an aggregated body of reducing substances $M_1, M_2, \ldots M_n$; $x_1 + x_2 + \ldots x_n = x_\alpha$, to obtain a sintered body containing part of said tellurium dioxide in reduced form, pulverizing and forming this sintered body and heating by electron beam the obtained formed body in cooperation with a chemically stable container to form a tellurium compound thin film on a support for use as an optical recording medium.

40. A method of producing an optical recording medium by mixing at least one element selected from the group consisting of Al, Si, Ti, V, W, Cr, Mn, Fe, Co, Ni, Cu, Zn, Ge, Mo, Cd, In, Sn, Sb, Ta, Bi, Pb, S, Se, C with tellurium dioxide for use as a reducing substance on said tellurium dioxide, heating in a form of $TeO_{2\ 100-x_\alpha}M_{x_\alpha}$, where $0 < x_\alpha < 80$ mol% and M is an amassed body of reducing substances $M_1, M_2, \ldots, M_n$; $x_1 + x_2 \ldots + x_n = x_\alpha$, to obtain a sintered body containing part of said tellurium dioxide in reduced form, pulverizing said sintered body to obtain powdered sintered body, combining this powdered sintered body with additive materials to form a mixture, and heating said mixture in cooperation with a chemically stable container in a vacuum so as to use said mixture as a vacuum deposition source to form a tellurium compound optical recording thin film containing the additive materials on a support.

41. A method of producing an optical recording medium comprising the steps of:
   (a) mixing tellurium dioxide $TeO_2$ and a reducing substance capable of reducing said $TeO_2$, said reducing substance represented as M;
   (b) forming a sintered body containing part of said $TeO_2$ in reduced form by treating the mixture obtained in step (a) to cause said part of $TeO_2$ to react with and be reduced by said reducing substance whereby said sintered body is an aggregated body of at least M-Te alloy, M-O oxide and $TeO_2$; and
   (c) depositing an optical recording thin film on a support by heating the sintered body obtained in step (b) in cooperation with a chemically stable container.

42. A method of producing an optical recording medium comprising the steps of:
   (a) mixing tellurium dioxide $TeO_2$ and a reducing substance capable of reducing said $TeO_2$, said reducing substance represented as M;
   (b) forming a sintered body containing part of said $TeO_2$ in reduced form by heating the mixture obtained in step (a) to cause said part of $TeO_2$ to react with and be reduced by said reducing substance whereby said sintered body is an aggregated body of at least M-Te alloy M-O oxide and $TeO_2$;
   (c) mixing the sintered body obtained in step (b) with an additive material;
   (d) depositing an optical recording thin film including said additive material on a support by heating the mixture obtained in step (c) in cooperation with a chemically stable container.

* * * * *